US008060324B2

(12) United States Patent
Priel et al.

(10) Patent No.: US 8,060,324 B2
(45) Date of Patent: Nov. 15, 2011

(54) DEVICE AND A METHOD FOR ESTIMATING TRANSISTOR PARAMETER VARIATIONS

(75) Inventors: Michael Priel, Hertzelia (IL); Dan Kuzmin, Givat Shmuel (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 591 days.

(21) Appl. No.: 12/162,179

(22) PCT Filed: Feb. 1, 2006

(86) PCT No.: PCT/IB2006/050342
§ 371 (c)(1),
(2), (4) Date: Jul. 25, 2008

(87) PCT Pub. No.: WO2007/088427
PCT Pub. Date: Aug. 9, 2007

(65) Prior Publication Data
US 2009/0006013 A1    Jan. 1, 2009

(51) Int. Cl.
*G01R 11/073* (2006.01)
*G01R 11/20* (2006.01)
*G01R 19/165* (2006.01)
*G06F 11/07* (2006.01)

(52) U.S. Cl. .............. 702/64; 702/57; 702/65; 702/179

(58) Field of Classification Search .............. 702/57, 702/64, 65, 106, 119, 123, 124, 185, 189; 327/200; 365/51; 703/19; 716/109, 110
See application file for complete search history.

(56) References Cited

U.S. PATENT DOCUMENTS

| | | | |
|---|---|---|---|
| 6,624,663 B2 | 9/2003 | Bailey et al. | |
| 6,941,536 B2 * | 9/2005 | Muranaka | 716/110 |
| 7,137,080 B2 * | 11/2006 | Acar et al. | 716/109 |
| 7,791,919 B2 * | 9/2010 | Shimizu | 365/51 |
| 2004/0128634 A1 | 7/2004 | Johnson et al. | |
| 2005/0043908 A1 | 2/2005 | Bhavnagarwala et al. | |
| 2005/0085032 A1 | 4/2005 | Aghababazadeh et al. | |
| 2005/0201188 A1 | 9/2005 | Donze et al. | |

FOREIGN PATENT DOCUMENTS

JP    58108769 A    6/1983

\* cited by examiner

*Primary Examiner* — Michael Nghiem
*Assistant Examiner* — Felix Suarez

(57) ABSTRACT

A method and a device for estimating parameter variations of transistors that belong to the same circuit. The method includes: providing the first circuit; providing a test circuit adapted to perform a first function and a stacked test circuit adapted to perform a second function that substantially equals the first function; wherein the test circuit, the stacked test circuit and the first circuit are processed under substantially the same processing conditions; determining a relationship between a parameter of the test circuit and a parameter of the stacked test circuit; and estimating parameter variations of transistors that belong to the first circuit in response to the determined relationship.

20 Claims, 6 Drawing Sheets

100

DEVICE AND A METHOD FOR ESTIMATING TRANSISTOR PARAMETER VARIATIONS

FIELD OF THE INVENTION

The present invention relates to a device and to a method for estimating parameter variations of transistors that belong to an integrated circuits.

BACKGROUND OF THE INVENTION

Mobile devices, such as but not limited to personal data appliances, cellular phones, radios, pagers, lap top computers, and the like are required to operate for relatively long periods before being recharged. These mobile devices usually include one or more processors as well as multiple memory modules and other peripheral devices.

Modern integrated circuits are manufactured by applying highly complex manufacturing process. These manufacturing processes are characterized by deviations in impurity concentration densities, oxide thickness, diffusion depths, difference in transistors dimensions and the like.

An integrated circuit includes a die. Multiple dies (also known as dices) are included in a single wafer. Wafers are usually manufactured in lots. Transistor parameters (such as delay and leakage current) can differ from one lot of wafers to another, from one wafer to another and even from one die to another.

An integrated circuit is regarded as operational if it was manufactured by a manufacturing process that is within a process window. The process window is delimited by a best case scenario and by a worst case scenario.

Differences in the delay of transistors that belong to the same integrated circuit can cause timing violations such as setup violations and hold violations.

These timing differences are more noticeable in high threshold voltage low leakage transistors that are usually used in mobile devices.

The delay difference between transistors that belong to the same integrated circuit increases as the supply voltage level (supplied to these transistors) decreases. The delay difference between different transistors of a certain integrated circuit is not known in advance and is also responsive to variables such as ambient temperature. In order to guarantee the proper functionality of the integrated circuit the supply level is not lowered (when the integrated circuit is active and not idle) below a supply voltage lower threshold.

This supply voltage lower threshold is defined in response to a possible existence of best case scenario transistors and worst case scenario transistors within the integrated circuit.

Each integrated circuit is manufactured by an instance of the manufacturing process. In most cases the transistors within the integrated circuit belong to a small subset out of all the possible transistors that can be manufactured within the relatively wide process window. Accordingly, the difference between the parameters of different transistors that belong to the same integrated circuit is smaller than the possible difference between the parameters of worst case scenario transistors and best case scenario transistors.

This supply voltage lower threshold causes a waste of power, as it is usually above the supply voltage level that can actually be supplied to the integrated circuit, without resulting in timing violations.

Silicone on Insulator (SOI) circuits are characterized by reduced transistors parameter variation but they have their own drawbacks. U.S. Pat. No. 6,624,663 of illustrates a prior art SOI circuit.

There is a need to estimate parameter variations of transistors that belong to an integrated circuit.

SUMMARY OF THE PRESENT INVENTION

A method and device for estimating parameter variations of transistors that belong to an integrated circuit, as described in the accompanying claims.

BRIEF DESCRIPTION OF THE DRAWINGS

The present invention will be understood and appreciated more fully from the following detailed description of embodiments thereof taken in conjunction with the accompanying drawings in which.

DETAILED DESCRIPTION OF THE DRAWINGS

Embodiments of the present invention illustrated in the accompanying drawings provide a method for estimating parameter variations of transistors that belong to a first circuit is provided. The method includes: (i) providing the first circuit; (ii) providing a test circuit adapted to perform a first function and a stacked test circuit adapted to perform a second function that substantially equals the first function; wherein the test circuit, the stacked test circuit and the first circuit are processed under substantially the same processing conditions; (iii) determining a relationship between a parameter of the test circuit and a parameter of the stacked test circuit; and (iv) estimating parameter variations of transistors that belong to the first circuit in response to the determined relationship.

The method may further include providing a supply voltage to the first circuit in response to the estimated parameter variation.

Embodiments of the present invention illustrated in the accompanying drawings also provide a device having parameter variations estimation capabilities is provided. The device includes a first circuit, a controller, a test circuit and a stacked test circuit. The test circuit is adapted to perform a first function and the stacked test circuit is adapted to perform a second function that substantially equals the first function. The test circuit, the stacked test circuit and the first circuit are processed under substantially the same processing conditions. The controller is adapted to determine a relationship between a parameter of the test circuit and a parameter of the stacked test circuit and to estimate parameter variations of transistors that belong to the first circuit in response to the determined relationship.

The device may further provide a supply voltage to the first circuit in response to the estimated parameter variation.

Figure 1:
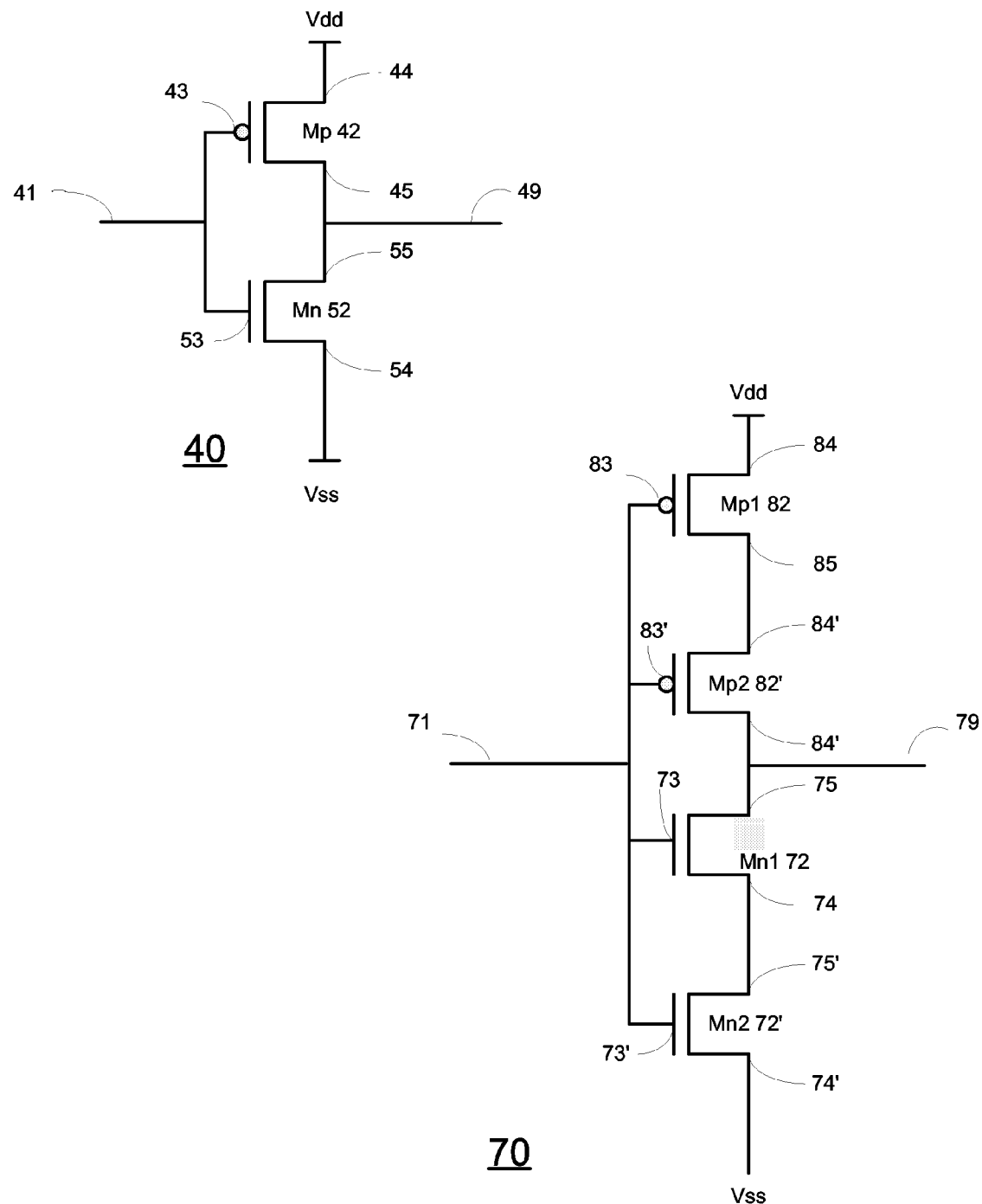
FIG. 1 illustrates an exemplary test circuit and an exemplary stacked test circuit, according to an embodiment of the invention.

FIG. 1 illustrates an exemplary test circuit 40 and an exemplary stacked test circuit 70, according to an embodiment of the invention.

Test circuit 40 is an inverter. It can belong to a test unit such as test unit 16 of FIG. 2. Test unit 16 can be located in a mobile device, but this is not necessarily so.

Test circuit 40 includes an PMOS transistor (Mp) 42 and a NMOS transistor 52. Mp 42 has a gate 43, a source 44 and a drain 45. Mn 52 has a gate 53, a source 54 and a drain 55. Gates 43 and 53 are connected to each other to form an input node 41 of the test circuit 40 while the drains 45 and 55 of both transistors are connected to form an output node 49 of the test circuit 40. The source 44 of Mp 12 is connected to a positive test power supply (Vdd) while the source 54 of Mn 52 is connected to a negative power supply (Vss). Vdd and Vss are provided by test supply unit 12. Vss can be zero and source 54 can be grounded.

Stacked test circuit 70 is an inverter. It can belong to a test unit such as test unit 16 of FIG. 2.

Stacked test circuit 70 includes a first NMOS transistor (Mn1) 72, a second NMOS transistor (Mn2) 72', a first PMOS transistor (Mp1) 82 and a second PMOS transistor (Mp2) 82'. Mn1 72 has a gate 73, a source 74 and a drain 75. Mn2 72' has a gate 73', a source 74' and a drain 75'. Mp2 82' has a gate 83', a source 84' and a drain 85'. Mp1 82 has a gate 83, a source 84 and a drain 85.

Gates 73, 73', 83 and 83' of Mn1 72, Mn2 73', Mp1 82 and Mp2 82' are connected to each other to form an input node 71 of the stacked test circuit 70. Drains 85' and 75 of Mp2 82' and Mn1 72 are connected to form an output node 79 of the stacked test circuit 70. Source 84 of Mp1 82 is connected to a positive test power supply (Vdd), source 74' of Mn2 72' is connected to a negative power supply (Vss). Vdd and Vss are provided by test supply unit 12. Source 84' of Mp2 82' is connected to drain 85 of Mp1 82. Source 74 of Mn1 72 is connected to drain 85' of Mn2 72'.

It is noted that other test circuits and stacked test circuits can be used. For example, the number of NMOS transistors and/or PMOS transistors per stacked test circuit can exceed two. Yet for another example more complex test circuits than inverters can be used. These more complex test circuits can include, for example logic gates, combinatorial logic and the like.

According to another embodiment of the invention a first stacked test circuit can include stacked NMOS transistors and a non-stacked PMOS transistor. A second stacked test circuit can include stacked PNOS transistors and a non-stacked NMOS transistor. The first stacked circuit can include transistors Mn1 72, Mn2 72' and Mp1 82. The second stacked circuit can include transistors Mn1 72, Mp1 82 and Mp2 82'. The first stacked circuit will assist in evaluating the parameter variations of NMOS transistors within the first circuit while the second stacked circuit will assist in evaluating parameter variations of PMOS transistors of the first circuit.

According to an embodiment of the invention the delay of the test circuit is compared to the delay of the stacked test circuit.

Figure 2:
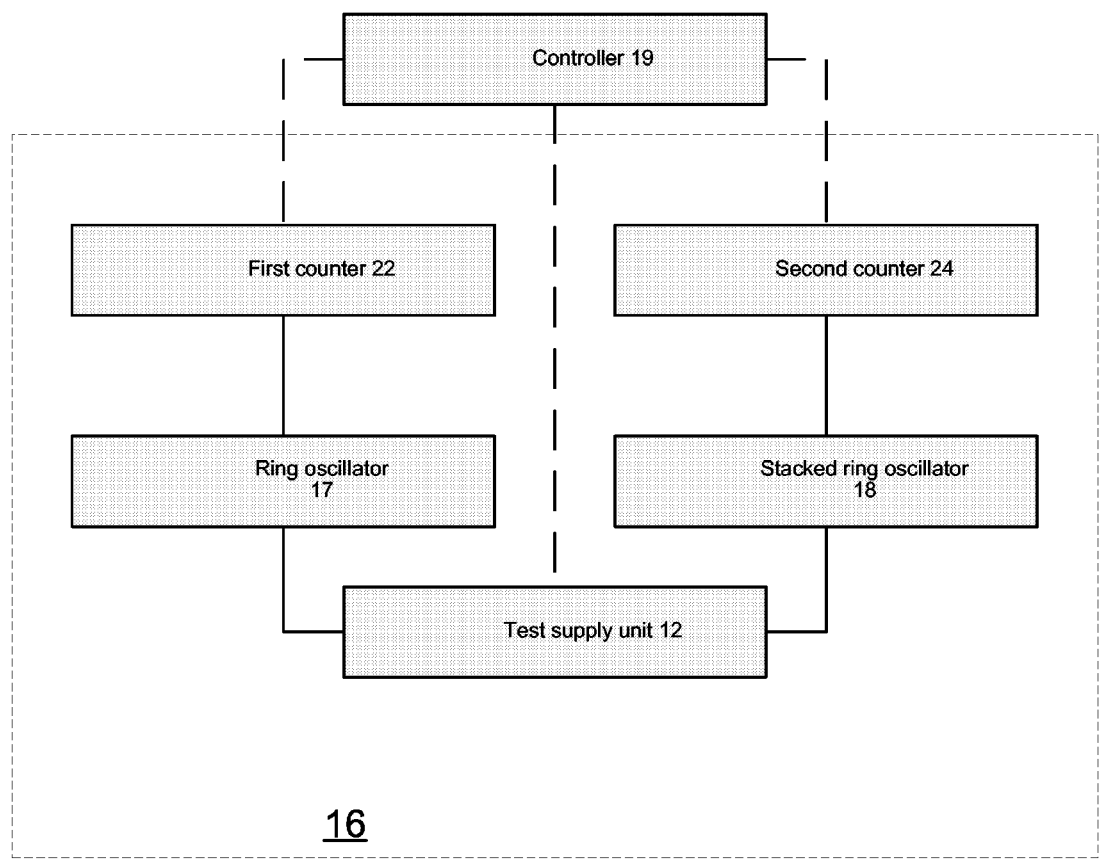
FIG. 2 illustrates a test unit according to an embodiment of the invention.

FIG. 2 illustrates a test unit 16, according to an embodiment of the invention.

Test unit 16 includes a ring oscillator 17, a stacked ring oscillator 18, a first counter 22, and a second counter 24. All these components are controlled by controller 19 that can reset one or more counters, cause one or more counters to count, stop the counting process and the like. Controller 19 also controls level of voltage supplied to test unit 16 by the test supply unit 12.

Ring oscillator 17 includes an odd number of test circuits 40 that are connected to each other in a serial manner such that the output node of one inverter is connected to the input node of the following inverter.

Stacked ring oscillator 18 includes an odd number of stacked test circuits 70 that are connected to each other in a serial manner such that the output node of one inverter is connected to the input node of the following inverter. It is noted that other configurations of ring oscillators can be used.

First counter 22 counts the oscillations of ring oscillator 17 within a predefined time window. The time window is determined by controller 19. Second counter 24 counts oscillations of stacked ring oscillator 18 within the same time window. The delay difference measurement accuracy is proportional to the length of the time windows and inversely proportional to the length of a oscillation period of the ring oscillator.

By comparing between the number oscillations of each of the ring oscillators 17 and 18 the device 10 can determine the delay difference between the stacked test circuit 70 and the test circuit 40 and accordingly evaluate the difference between the delays of transistors within the first circuit.

It is noted that a single counter can be used for measuring the delay difference. The oscillations of the ring oscillator 18 increase the value of the counter while the oscillations of the stacked ring oscillator shall decrease the value of the counter. It is noted that other equivalent circuits can be used.

In response to the delay difference represented by the different values of the first and second counters 22 and 24 the device 10 can decrease or increase the supply voltage level that is provided to the first circuit 20.

Figure 3:
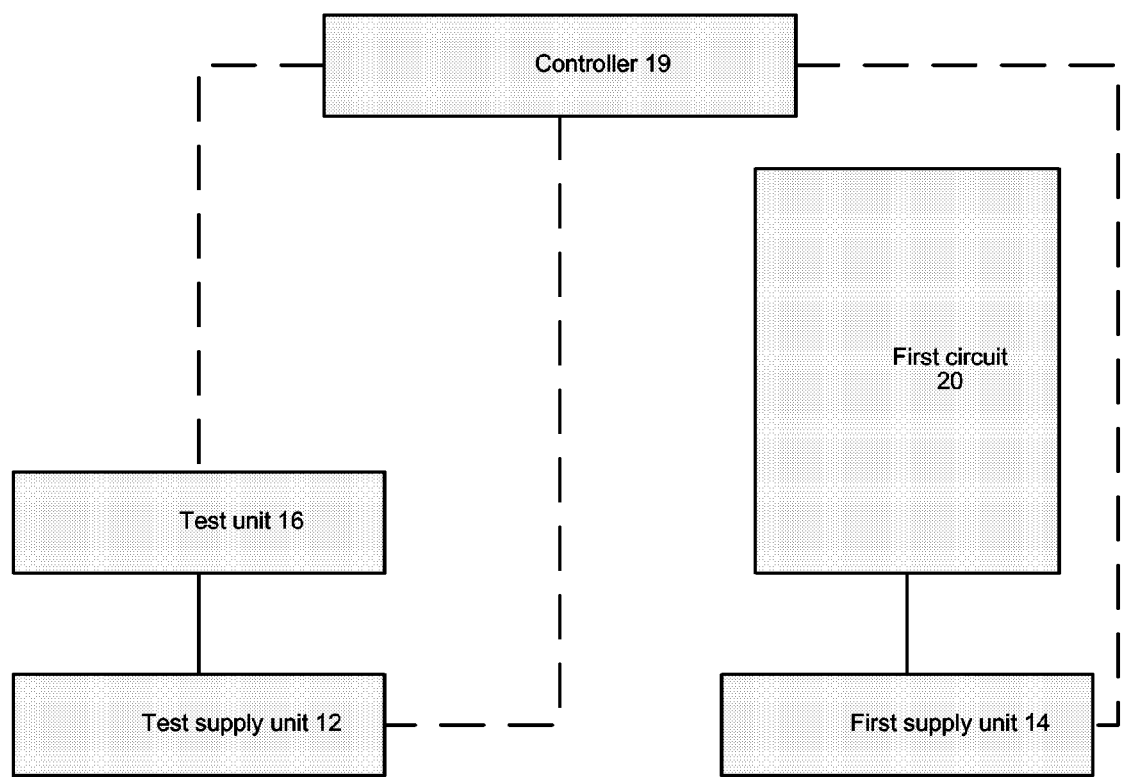
FIG. 3 illustrates a device according to an embodiment of the invention.

FIG. 3 illustrates a device 10 according to an embodiment of the invention.

Device 10 includes a first circuit 20, a controller 19, a test unit 16, a test supply unit 12 and a first supply unit 14. The test unit 16 includes at least one test circuit 40 and at least one stacked test circuit 70.

Controller 19 is connected to the test unit 16, test supply unit 12 and the first supply unit 14. The first test supply unit 14 is connected to the first circuit 20.

It is noted that device 10 can include multiple frequency regions and that each frequency region can have its own test unit and unique supply unit.

The controller 19 is adapted to determine a relationship between a parameter of the test circuit 40 and a parameter of the stacked test circuit 70. Controller 19 is also adapted to estimate parameter variations of transistors that belong to the first circuit 20 in response to the determined relationship.

Conveniently, the first circuit 20, the test circuit 40 and the stacked test circuit 70 are manufactured on a single die.

Conveniently, the controller 19 is adapted to measure a parameter of the stacked test circuit 70, measure a parameter of the test circuit 40 and compare between the measured parameters.

Conveniently, the controller 19 is adapted to control a test supply unit 12 to supply a first supply voltage level to the test circuit 40 and to the stacked test circuit 70, to calculate a relationship between the parameter of the test circuit and the parameter of the stacked test circuit, and to control an alteration of the supply voltage level and to re-calculate the relationship.

Conveniently, the device 10 is adapted to receive an acceptable parameter variation difference or to calculate the acceptable parameter variation difference. This acceptable variation difference is a maximal parameter variation between transistors of the first circuit that allows a proper function of the first circuit 20. Larger parameter variations can cause timing violations, high leakage currents and the like.

The parameter variation difference is responsive to the supply voltage level. Higher supply voltage levels result in lower parameter variations. Merely supplying higher then required supply voltage levels can guarantee that the first circuit functions properly but on the other hand consumes too much power. The inventors found that by applying the describe method and device a reduction of about 200 mV in the supply voltage level can be gained without hampering the functionality of the circuit.

Conveniently, device 10 tests the test circuit and the stacked test circuit under different supply voltage levels until if finds a supply level that can guarantee that the acceptable parameter variation is maintained.

Conveniently, the controller 19 is adapted to search for a supply voltage range that when supplied to the first circuit 20 will result in parameter variation difference level that does not exceed the acceptable parameter variation difference.

Conveniently, the controller 19 is adapted to control a first supply unit 14 such as to provide to the first circuit 20 a supply voltage that has a level that is within the supply voltage range. Conveniently, the level of the supply voltage is substantially a lowest level in the voltage supply range.

The controller 19 is adapted to repetitively determine, estimate and control a supply of voltage to the first circuit 20. These repetitions can be triggers by various events (for example entering active mode, temperature change), can be executed according to a predefined pattern, can be executed in a pseudo-ransom manner, in a random manner, once after a boot of the system, and the like.

The controller 19 determines the level of voltage supply provided to the first circuit 20 in response to the estimation.

Conveniently, the measured parameter is a delay or a leakage current.

According to an embodiment of the invention the test circuit and the stacked test circuit can be shut down when they are not required.

Figure 4:
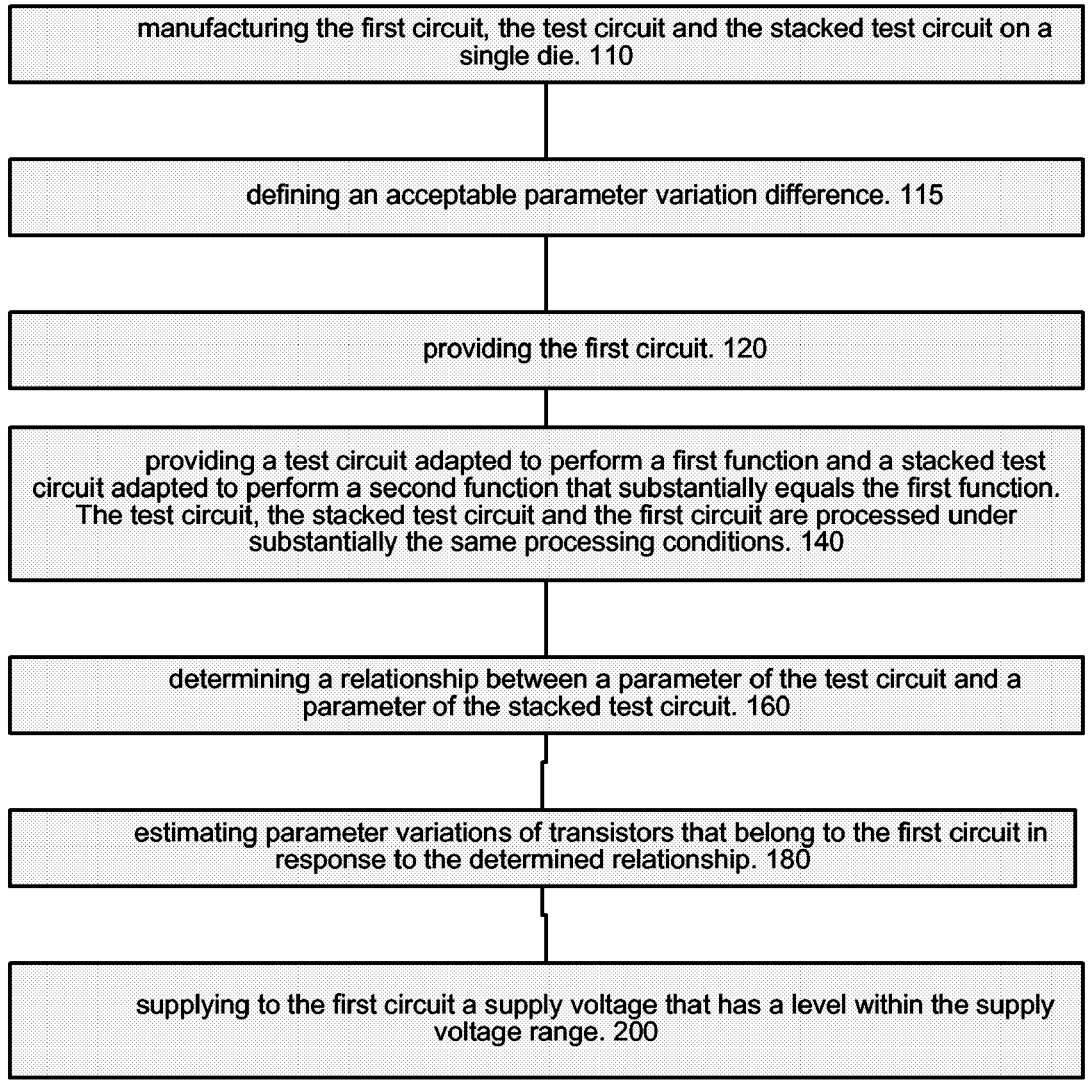
FIG. 4 illustrates method for estimating parameter variations of transistors that belong to a first circuit, according to an embodiment of the invention.

FIG. 4 illustrates method 100 for estimating parameter variations of transistors that belong to a first circuit.

Method 100 starts by stage 110 of manufacturing the first circuit, the test circuit and the stacked test circuit on a single die. Stage 110 can be replaced by a stage of receiving an integrated circuit that includes the first circuit, the test circuit and the stacked test circuit.

Stage 110 is followed by stage 115 of defining an acceptable parameter variation difference.

Stage 115 is followed by stage 120 of providing the first circuit.

Stage 120 is followed by stage 140 of providing a test circuit adapted to perform a first function and a stacked test circuit adapted to perform a second function that substantially equals the first function. The test circuit, the stacked test circuit and the first circuit are processed under substantially the same processing conditions.

Stage 140 is followed by stage 160 of determining a relationship between a parameter of the test circuit and a parameter of the stacked test circuit.

The determination of whether to alter the voltage can be responsive to a control parameter. The control parameter can end the process once a certain number of iterations is completed, once a predefined voltage scan is found, or when the a voltage supply range that guarantees the proper function of the first circuit is found.

Conveniently, stage 160 includes searching for a supply voltage range that when supplied to the first circuit will result in parameter variation difference level that does not exceed the acceptable parameter variation difference.

Stage 160 is followed by stage 180 of estimating parameter variations of transistors that belong to the first circuit in response to the determined relationship.

Stage 180 is followed by stage 200 of supplying to the first circuit a supply voltage that has a level within the supply voltage range. It is noted that this voltage can be further supplied to other circuits.

Conveniently, the supply voltage that is supplied to the first circuit has a level that is substantially a lowest level in the voltage supply range.

Conveniently, the parameter is a delay or a leakage current.

Figure 5:
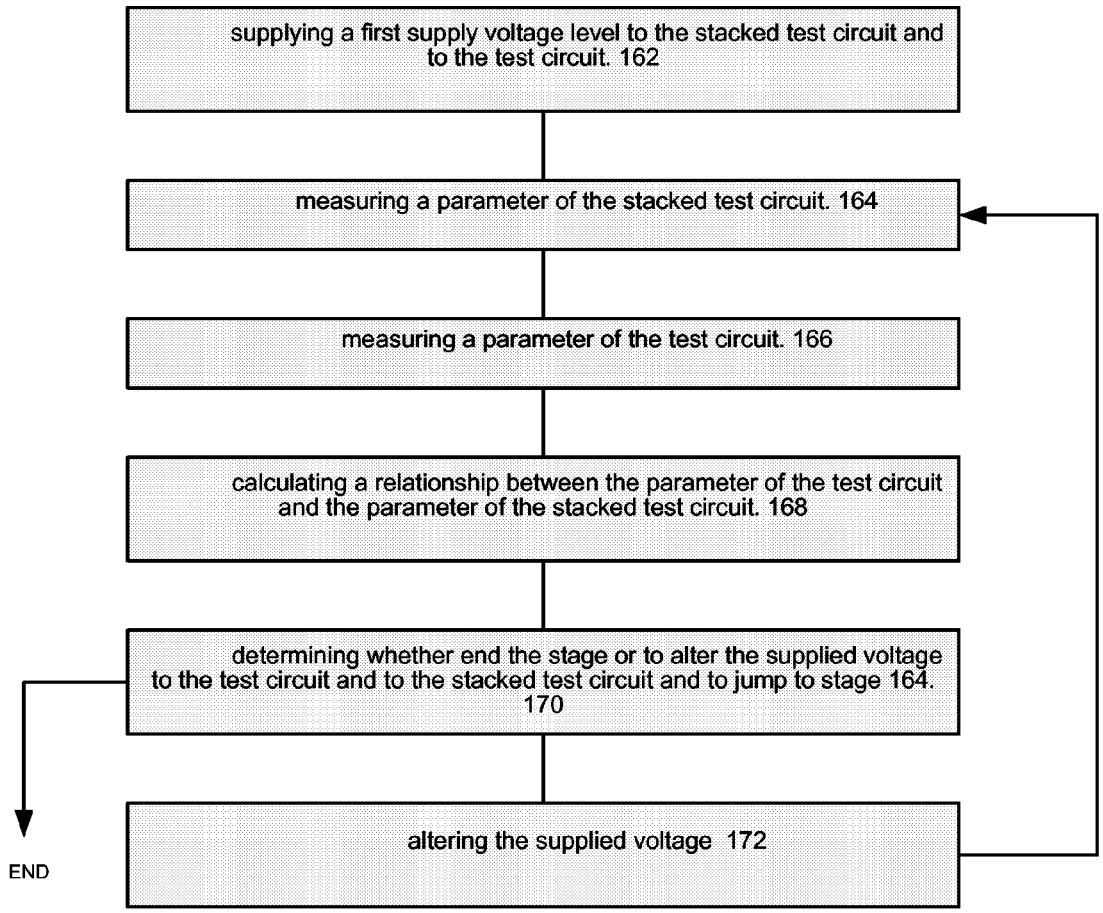
FIG. 5 illustrates a determination stage, according to an embodiment of the invention.

FIG. 5 illustrates a determination stage 160, according to an embodiment of the invention.

Stage 160 starts by stage 162 of supplying a first supply voltage level to the stacked test circuit and to the test circuit.

Stage 162 is followed by stage 164 of measuring a parameter of the stacked test circuit.

Stage 164 is followed by stage 166 of measuring a parameter of the test circuit.

Stage 166 is followed by stage 168 of calculating a relationship between the parameter of the test circuit and the parameter of the stacked test circuit.

Stage 168 is followed by stage 170 of determining whether end the stage or to alter the supplied voltage to the test circuit and to the stacked test circuit and to jump to stage 164. The determination can be responsive to the number of iterations of stages 164-170, to whether a supply voltage range that can allow the proper functioning of the first circuit is found and the like.

Stage 170 is selectively followed by stage 172 of altering the supplied voltage and jumping to stage 164.

Figure 6:
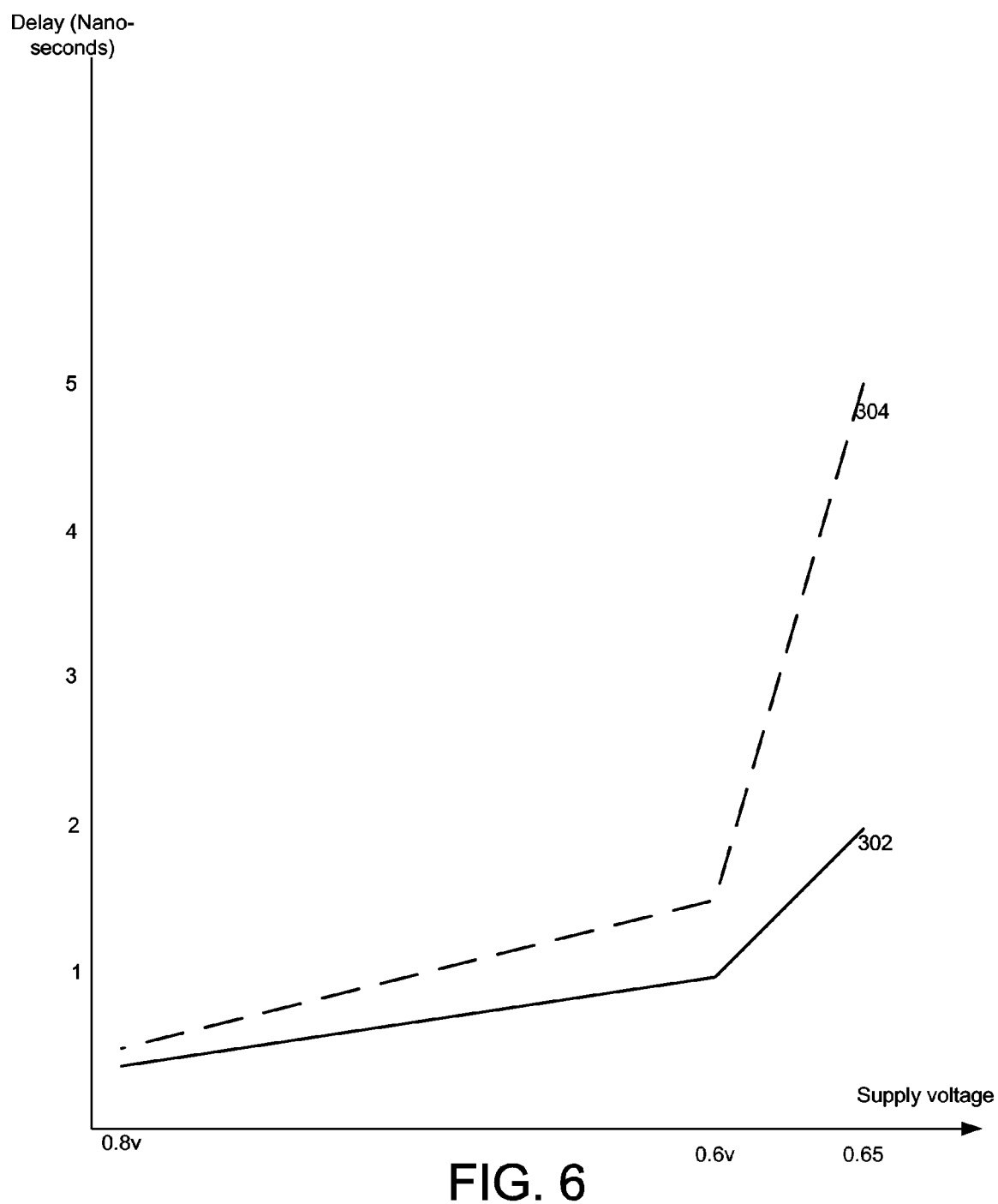
FIG. 6 illustrates exemplary delay mismatches according to an embodiment of the invention.

FIG. 6 illustrates exemplary delay mismatches according to an embodiment of the invention.

Curve 302 illustrates the relationship between the delay of test circuit 40 and the supply voltage supplied to test unit 16. Curve 304 illustrates the relationship between the delay of stacked test circuit 70 and the supply voltage supplied to the test unit 16.

Table 1 illustrates various points of curves 302 and 304.

| Supply voltage level | Delay of test circuit 40 | Delay of stacked test circuit 70 | Delay difference | Acceptable? |
| --- | --- | --- | --- | --- |
| 0.8 v | 0.4 nS | 0.5 nS | 0.1 nS | Yes |
| 0.65 v | 1 nS | 1.5 nS | 0.5 nS | Yes |
| 0.6 v | 2 nS | 5 nS | 3 nS | NO |

In this case an acceptable delay difference of about 0.5 nSec was defined. Accordingly the voltage supply provided to the first circuit will not be lower than 0.65 Volts.

It is noted that each row of the table represents one measurement sequence. Thus, three measurement sequences were required to determine the range of supply voltages (1.2-0.6V) that can be supplied to the first circuit. In order to reduce the power consumption of the first circuit a supply voltage of 0.65 volts (or slightly above 0.65 volts) should be supplied.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for estimating parameter variations of transistors that belong to a first circuit, the method comprises:
   providing the first circuit;
   providing a test circuit adapted to perform a first function and a stacked test circuit adapted to perform a second function that substantially equals the first function wherein the first circuit, the test circuit, and the stacked test circuit are different circuits;
   wherein the test circuit, the stacked test circuit and the first circuit are processed under substantially the same processing conditions;
   determining a relationship between a parameter of the test circuit and a parameter of the stacked test circuit, wherein the parameter of the test circuit is a same type of parameter as the parameter of the stacked test circuit; and
   estimating parameter variations of transistors that belong to the first circuit in response to the determined relationship; wherein the determining comprises searching for a supply voltage range that when supplied to the first circuit will result in parameter variation difference level that does not exceed an acceptable parameter variation difference.

2. The method according to claim 1 wherein the providing is preceded by manufacturing the first circuit, test circuit and stacked test circuit on a single die.

3. The method according to claim 1 wherein the determining comprises measuring the parameter of the stacked test circuit, measuring the parameter of the test circuit and calculating a relationship between the parameter of the test circuit and the parameter of the stacked test circuit.

4. The method according to claim 1 wherein the determining comprises:
   supplying a supply voltage level to the stacked test circuit and to the test circuit;
   calculating a relationship between the parameter of the test circuit and the parameter of the stacked test circuit; and
   altering the supply voltage level and jumping to calculating the relationship.

5. The method according to claim 1 wherein the method further comprises defining the acceptable parameter variation difference.

6. The method according to claim 5 wherein the method comprises supplying to the first circuit a supply voltage; wherein the supply voltage has a level within the supply voltage range.

7. The method according to claim 5 wherein the method comprises supplying to the first circuit a supply voltage having a level that is substantially a lowest level in the supply voltage range.

8. The method according to claim 1 wherein the method comprises repetitively performing the stages of determining, estimating and supplying to the first circuit a supply voltage, wherein the supply voltage is responsive to the estimation.

9. The method according to claim 1 wherein the parameter is a delay.

10. The method according to any claim 1 wherein the parameter is a leakage current.

11. A device having parameter variations estimation capabilities, the device comprises:
    a first circuit;
    a controller, and a test unit that comprises a test circuit adapted to perform a first function and stacked test circuit adapted to perform a second function that substantially equals the first function, wherein the first circuit, the test circuit, and the stacked test circuit are different circuits;
    wherein the test circuit, the stacked test circuit and the first circuit are processed under substantially the same processing conditions;
    wherein the controller is adapted to determine a relationship between a parameter of the test circuit and a parameter of the stacked test circuit, to estimate parameter variations of transistors that belong to the first circuit in response to the determined relationship, and to search for a supply voltage range that when supplied to the first circuit will result in parameter variation difference level that does not exceed an acceptable parameter variation difference, wherein the parameter of the test circuit is a same type of parameter as the parameter of the stacked test circuit.

12. The device according to claim 11 wherein the first circuit, the test circuit and the stacked test circuit are manufactured on a single die.

13. The device according to claim of claims 11 wherein the controller is adapted to measure the parameter of the stacked test circuit, measure the parameter of the test circuit and compare between the measured parameters.

14. The device according to claim 11 wherein the controller is adapted to control a test supply unit to supply a first supply voltage level to the test circuit and to the stacked test circuit; to calculate a relationship between the parameter of the test circuit and the parameter of the stacked test circuit, to control an alteration of the supply voltage level and to re-calculate the relationship.

15. The device according to claim 11 wherein the device is adapted to calculate the acceptable parameter variation difference.

16. The device according to claim 15 wherein the controller is adapted to control a first supply unit adapted to provide to the first circuit a supply voltage; wherein the supply voltage has a level that is within the supply voltage range.

17. The device according to claim 15 wherein the controller is adapted to control a first supply unit adapted to provide to the first circuit a supply voltage that is substantially a lowest level in the supply voltage range.

18. The device according to claim 11 wherein the controller is adapted to repetitively determine, estimate and control a supply of voltage to the first circuit; wherein the supply voltage is responsive to the estimation.

19. The device according to claim 11 wherein the parameter is a delay.

20. A method for estimating parameter variations of transistors that belong to a first circuit, the method comprises:
    providing the first circuit;
    providing a test circuit and a stacked test circuit, wherein the test circuit, the stacked test circuit and the first circuit are processed under substantially the same processing conditions, and wherein the first circuit, the test circuit, and the stacked test circuit are different circuits;
    measuring a parameter of the test circuit and a parameter of the stacked test circuit at a plurality of supply voltage levels, wherein the parameter of the test circuit is a same type of parameter as the parameter of the stacked test circuit;
    comparing the parameter of the test circuit with the parameter of the stacked test circuit at each of the plurality of supply voltage levels to determine a parameter variation difference level between the parameter of the test circuit and the parameter of the stacked test circuit at each of the supply voltage levels;

estimating parameter variations of transistors that belong to the first circuit in response to the difference between the parameter of the test circuit and the parameter of the stacked test circuit; and determining a supply voltage level of the plurality of supply voltage levels that when supplied to the first circuit will result in the parameter variation difference level that does not exceed an acceptable parameter variation difference.

* * * * *